United States Patent
Berney et al.

(10) Patent No.: US 9,500,724 B2
(45) Date of Patent: Nov. 22, 2016

(54) MAGNETIC ENCODER

(71) Applicant: PORTESCAP SA, La Chaux de Fonds (CH)

(72) Inventors: Julian Berney, La Chaux de Fonds (CH); Julien Baudey, Ayze (FR)

(73) Assignee: PORTESCAP SA, La Chaux de Fonds (CH)

( * ) Notice: Subject to any disclaimer, the term of this patent is extended or adjusted under 35 U.S.C. 154(b) by 432 days.

(21) Appl. No.: 14/078,744

(22) Filed: Nov. 13, 2013

(65) Prior Publication Data
US 2014/0132123 A1 May 15, 2014

(30) Foreign Application Priority Data

Nov. 14, 2012 (CH) ...................................... 2382/12

(51) Int. Cl.

| | |
|---|---|
| *G01R 33/07* | (2006.01) |
| *H02K 29/08* | (2006.01) |
| *H02K 29/06* | (2006.01) |
| *G01D 11/30* | (2006.01) |

(Continued)

(52) U.S. Cl.
CPC .................. *G01R 33/07* (2013.01); *G01B 7/30* (2013.01); *G01D 5/145* (2013.01); *G01D 11/30* (2013.01); *H02K 11/215* (2016.01); *H02K 29/06* (2013.01); *H02K 29/08* (2013.01)

(58) Field of Classification Search
CPC ...... H02K 29/06; H02K 29/08; H02K 11/21; H02K 11/215; G01R 33/06; G01R 33/07; G01R 33/09; H01L 27/22; H01L 43/04; H01L 43/06; H01L 43/065; H01L 43/14; G01D 5/145; G01D 11/30; G01B 7/30

USPC ........... 310/68 B; 324/207.2, 117 H, 207.24, 324/207.25, 251; 257/421
See application file for complete search history.

(56) References Cited

U.S. PATENT DOCUMENTS

| | | | |
|---|---|---|---|
| 5,508,611 A * | 4/1996 | Schroeder ................. | F02P 7/07 174/545 |
| 6,469,499 B2 * | 10/2002 | Delaporte .......... | G01D 5/24476 324/207.13 |
| 7,804,210 B2 * | 9/2010 | O'Day ................... | G01D 5/244 310/12.01 |

(Continued)

FOREIGN PATENT DOCUMENTS

| | | |
|---|---|---|
| EP | 0680103 A1 | 11/1995 |
| EP | 1505371 A1 | 2/2005 |

(Continued)

*Primary Examiner* — Terrance Kenerly
*Assistant Examiner* — Alexander Singh
(74) *Attorney, Agent, or Firm* — Cantor Colburn LLP

(57) ABSTRACT

Encoder including
  a moveable part with at least one magnetic dipole,
  at least one Hall Effect sensor with a sensitive area arranged to detect a magnetic field created by the magnetic dipole,
  at least one circuit board with a main thickness and having an attachment portion on which the Hall Effect sensor is mounted,
where the Hall Effect sensor is a semiconductor die sensor with the sensitive area arranged on an external face of the semiconductor die,
where the Hall Effect sensor is flip chip mounted onto the attachment portion of the circuit board, with the sensitive area in contact with the circuit board, and where the attachment portion is arranged between the Hall Effect sensor and the magnetic dipole and presents a reduced thickness compared to the main thickness of the rest of the circuit board.

13 Claims, 3 Drawing Sheets

(51) Int. Cl.
*G01B 7/30* (2006.01)
*G01D 5/14* (2006.01)

(56) References Cited

U.S. PATENT DOCUMENTS

| | | |
|---|---|---|
| 2002/0179987 A1 | 12/2002 | Meyer et al. |
| 2003/0169033 A1 | 9/2003 | Tromblee et al. |
| 2012/0200203 A1* | 8/2012 | Wallner ................ H02K 29/08 310/68 B |
| 2013/0181304 A1* | 7/2013 | Milano .............. G01R 33/0076 257/421 |

FOREIGN PATENT DOCUMENTS

| | | |
|---|---|---|
| FR | 2902872 A1 | 12/2007 |
| JP | 11051696 | 2/1999 |

* cited by examiner

Fig. 1 - Prior Art
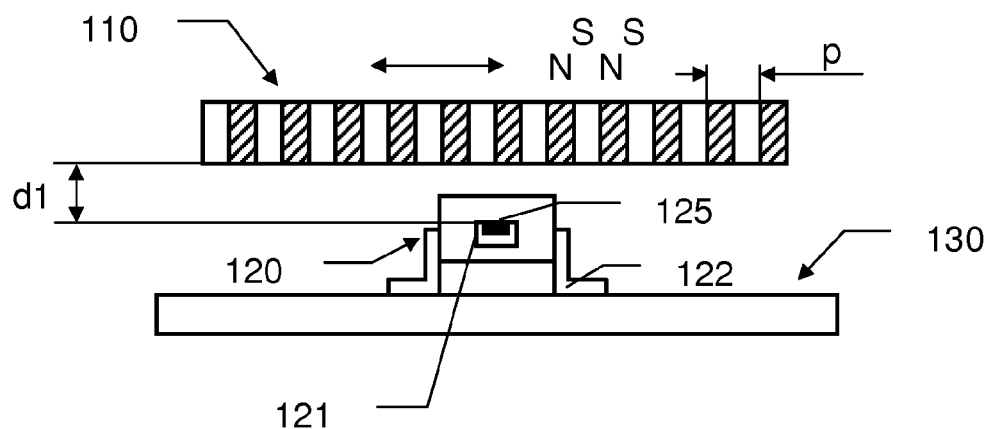
Fig. 2 - Prior Art
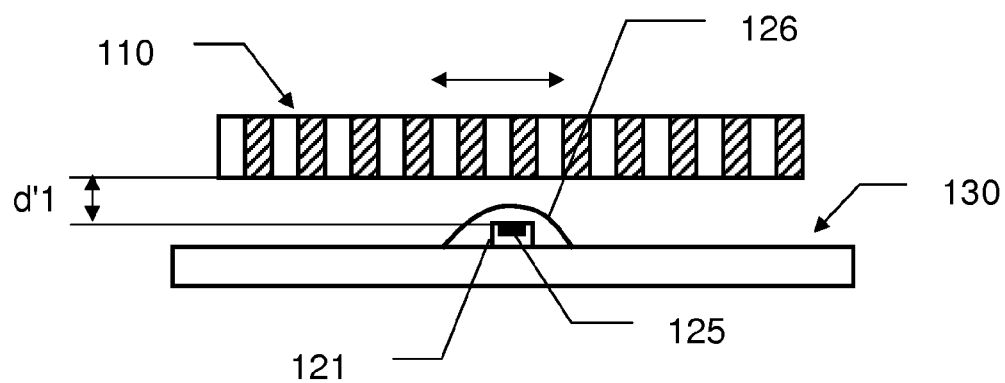

MAGNETIC ENCODER

CROSS REFERENCE TO RELATED APPLICATION

This application claims the benefit of Switzerland Patent Application Number 02382/12 filed on 14 Nov. 2012, the contents of which are herein incorporated by reference in their entirety.

TECHNICAL FIELD

The present invention relates to encoders for electric motors and especially to encoders comprising a Hall Effect sensor.

BACKGROUND

A typical encoder from the prior art is an encoder having a magnetic disk with a polar pitch p, attached to the rotation axis of an electric motor and a circuit board supporting one or two Hall Effect sensors in the vicinity of the magnetic disk, as represented on FIG. 1 or FIG. 2. To enhance the accuracy or resolution of such encoder, the distance between the magnetic disk and the Hall Effect sensor has to be as small as possible. However, due to production variations, and tolerances of the components, a minimal gap is required between the sensor and the magnetic disk. This minimal gap has a negative impact onto the accuracy and is a limit to the reduction of the size of the encoder and of the magnet, as this magnet shall produce a minimal magnetic field greater than the Hall Effect sensor limit of detection. In other words, this minimal gap is a limit to a reduction of the polar pitch, which could lead to a reduction of the packaging of the encoder and/or an increase of the resolution of the encoder.

A reduction of the polar pitch (either by reducing the size of the magnetic dipole or by increasing the number of pole alternances) leads to a reduction of the magnetic field and, as the size of the magnetic sensor remains the same, a negative effect on the sensed signal is obtained because it is not possible to position the magnetic sensor closer to the magnetic dipole of the encoders of FIGS. 1 and/or 2. FIG. 5 illustrates that the magnetic fields strongly decreases with the distance from the magnetic dipole.

Another point to consider is an angular distance between two magnetic sensors as illustrated in FIG. 1 or 2, if the moveable magnetic dipole is a disk. A reduction of this angular distance is desirable, to decrease a phase shift error, therefore, the magnetic sensor of FIG. 2 could be more interesting for this aspect, but there is still the minimum gap between the sensor and the magnetic dipole which is a limit to the encoder downsizing or resolution increase, as being critical for the detection of the magnetic field.

BRIEF SUMMARY

The present invention aims to solve these aforementioned drawbacks and is directed to an encoder having a reduced packaging compared to the known encoders, and with a good accuracy/resolution, without jeopardizing the mechanical resistance of the encoder or its internal components.

With this goal in mind, a first aspect of the invention is an encoder comprising:
  a moveable part with at least one magnetic dipole,
  at least one magnetic sensor with a sensitive area arranged to detect a magnetic field created by the magnetic dipole,
  at least one circuit board with a main thickness and having an attachment portion on which the magnetic sensor is mounted,
  characterized in that the magnetic sensor is a semiconductor die sensor with the sensitive area arranged on an external face of the semiconductor die,
  in that the magnetic sensor is mounted onto the attachment portion of the circuit board, with the sensitive area in contact with the circuit board, and in that the said attachment portion is arranged between the magnetic sensor and the magnetic dipole and presents a reduced thickness compared to the main thickness of the rest of the circuit board.

The encoder according to the present invention reduces the overall packaging, as the distance between the sensitive area and the magnetic dipole depends on few components. In other words, the stack up calculation involves a few references, so that it is possible to reduce the minimum gap between the circuit board and the magnetic dipole. In order to avoid the influence of the magnetic sensor thickness, the sensitive area is mounted in contact with the circuit board (in other words, the sensor is flip chip mounted), the circuit board being placed between the sensitive area and the magnetic dipole. In addition, the local reduction of the thickness of the circuit board allows positioning the magnetic dipole and the magnetic sensor closer together, without jeopardizing the mechanical strength of the rest of the circuit board. In other words, the main thickness of the circuit board presents a rigidity sufficient to provide a correct mechanical resistance, even with the reduced thickness area allocated for attaching the Magnetic sensor. The reduction of thickness is a reduction of the thickness of the circuit board itself (i.e. its structural frame), and not only a reduction of thickness due to a local interruption of a paint/resin insulation layer of the circuit board for example. The magnetic sensor is a semi conductor die chip, and may be for example a silicon die chip. The invention is particularly well suited for encoders having no ferromagnetic counterpart, as in this case, with no ferromagnetic counterpart, the magnetic field travels in the air, so that the distance between the sensitive area and the magnetic dipole is critical and should be as small as possible. The present invention allows to reduce the polar pitch, as the distance between the magnetic sensor and the magnetic dipole is reduced, so that it is possible to reduce the overall packaging (axial and radial), or to increase the resolution, still having a strong enough magnetic field at the magnetic sensor location, without compromising the structural strength, as the circuit board is locally sized down. It may also be concluded that for the same size of encoder, the inherently higher resolution of the encoder can reduce the overall composite complexity (eliminate a gearbox for example) or enhance accuracy in the application without more cost or without having to move to alternate technology like optical vs. magnetic sensing.

According to one embodiment, the magnetic sensor is a Hall Effect sensor.

According to one embodiment, the encoder comprises only one attachment portion of a reduced thickness and it comprises two magnetic sensors, with a sensitive area arranged to detect a magnetic field created by the magnetic dipole, mounted onto the attachment portion, the sensitive area being in contact with the attachment portion. A compact incremental encoder is proposed with this embodiment, and the cost is not increased due to a second attachment portion: the two Magnetic sensors are both arranged onto the same attachment portion of the circuit board.

According to one embodiment, the two magnetic sensors are Hall Effect sensors.

According to one embodiment, the moveable part comprises several magnetic dipoles spaced by a predetermined polar pitch p, and the two magnetic sensors are spaced by a distance lower than two polar pitches. This arrangement, with the flip chip silicon die sensors, allows a reduced distance between the two Magnetic sensors, so that the attachment portion presents a reduced area, and the mechanical resistance of the circuit board is not affected. The Magnetic sensors may be arranged from each other at a distance lower than 1.5 millimeter. The polar pitch is the distance between two following poles of same nature (North Pole to the next North Pole for example).

According to one embodiment, the encoder comprises other electronic components, attached onto the attachment portion. The overall space required for all the components is reduced.

According to one embodiment, the moveable part is moveable in rotation around a rotation axis and attached to a rotor of an electric motor.

According to one embodiment, the circuit board is integrated in the electric motor. It is advantageous to arrange the encoder inside the electric motor, to benefit from the external housing of the motor, to provide a mechanical protection to the encoder.

According to one embodiment, the moveable part comprises at least a magnet.

According to one embodiment, the moveable part presents a circular shape with predetermined external radius lower than 8 millimeters, and the two magnetic sensors are arranged at a distance from the rotation axis comprised between the external radius and the external radius minus 1.5 millimeter, or the at least one Magnetic sensor is arranged at a distance from the rotation axis comprised between the external radius and the external radius minus 1.5 millimeter.

According to one embodiment, the polar pitch is lower than 3 millimeters. Ideally, the polar pitch is lower than 2 millimeters and more ideally, lower than 1.6 millimeters.

According to one embodiment, the circuit board comprises only one conductive layer onto which the two magnetic sensors are mounted with the sensitive area in contact with the conductive layer, or onto which the at least one magnetic sensor is mounted with the sensitive area in contact with the conductive layer. According to this embodiment, the circuit board presents two non conductive layers which are sandwiching the conductive layer, except in the attachment portion where one of the non conductive layers, preferably the frame layer, is opened to achieve the reduction of thickness.

According to one embodiment, the only one conductive layer is arranged between a flexible insulating layer and a rigid insulating layer being a structural frame of the circuit board, the flexible insulating layer being thinner than the rigid insulating layer, and the reduced thickness is formed by an opening in the rigid insulating layer. It is advantageous to keep only the thinnest layer in the area of the attachment portion, to minimize as much as possible the thickness between the Magnetic sensor and the moveable part.

According to one embodiment, the encoder is arranged inside a housing and the only one conductive layer comprises a connecting portion located outside of the housing, and arranged to cooperate with a connector. The cost is reduced, as there is no additional interface on the circuit board to provide a connection, the latter being directly done with the connecting portion.

According to one embodiment, the encoder comprises electronic components attached onto the circuit board, and the circuit board is over-molded so as to encapsulate the electronic components into an over-molding material. This embodiment provides a protection of the components if the encoder is used in specific atmospheres, saturated with water for example.

BRIEF DESCRIPTION OF THE DRAWINGS

Other characteristics and advantages of the present invention will appear more clearly from the following detailed description of particular non-limitative examples of the invention, illustrated by the appended drawings where:

FIG. 1 represents an encoder known from the prior art;

FIG. 2 represents a variant of the known encoder of FIG. 1;

DETAILED DESCRIPTION

Figure 3:
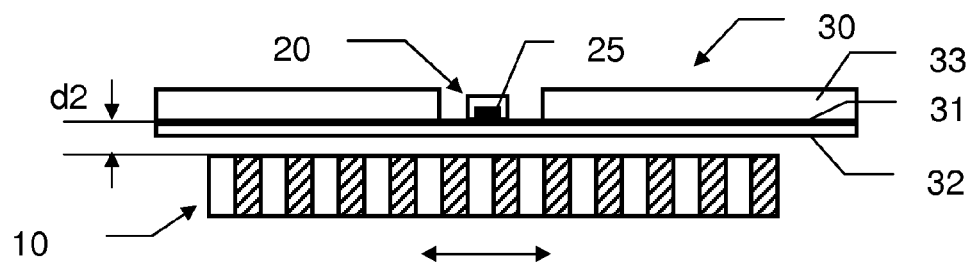
FIG. 3 represents an encoder according to the present invention.

The encoder represented at FIG. 1 comprises a moveable part 110 made of an alternation of magnetic dipoles North-South as represented, defining a polar pitch p. The encoder comprises a Hall Effect sensor 120 comprise a silicon die chip 121 with a sensitive area 125 over-molded in an external case. The Hall Effect sensor 120 is mounted onto a circuit board 130 via its contact pins 122.

A movement of the moveable part 110 will create a change of the magnetic field in the vicinity of the sensitive area 125. Provided that this magnetic field is greater than the limit of detection of the Hall Effect sensor 120, the movement of the moveable part will be encoded. The distance d1 is then an important parameter in the performance of the represented encoder. It will determine the minimum limit of detection required in relation to the magnetic dipole characteristics. To reduce the packaging of the encoder and the costs of the Hall Effect sensor, it is important to lower as much as possible this distance d1.

The distance d1 depends on several components and their tolerances coming from the manufacturing.

The encoder represented on FIG. 2 is also known in the prior art. The Hall Effect sensor is a silicon die chip 121 with its sensitive area 125 molded in a resin 126 to provide the attachment onto the circuit board 130. The distance d'1 between the magnetic dipole 130 and the sensitive area is no more depending from the contact pins of the sensor, but the height of the resin 126 and its variability are affecting the distance d'1, so that it cannot be significantly reduced, compared to d1.

The encoder according to the present invention represented at the FIG. 3 provides a lowered distance d2 between the sensitive surface 25 of the Hall Effect sensor 20 and the moveable part 10 comprising a plurality of magnetic dipoles. To achieve this reduced distance d2, the Hall Effect sensor is a silicon die sensor, with its sensitive area 25 arranged on an external face. The Hall Effect sensor 20 is flip chip mounted onto the circuit board 30, with the sensitive area 25 in contact with the circuit board 30. This design reduces the variations of dimensions coming from the chip, as there are not anymore any tolerances related to the distance between the connecting pins and the sensitive area 25, or related to the position of the sensitive area in the over-molding, involved in the stack up calculation of d2.

In addition, the circuit board 30 is arranged to provide to the Hall Effect sensor 20 an attachment portion with a reduced thickness. The circuit board 30 presents a conductive layer 31 sandwiched between a first insulating (or non conductive) layer 33 and a second insulating (or non conductive) layer 32. The first layer 33 is rigid (i.e. it is the structural frame of the circuit board), so that the mechanical strength of the circuit board is mainly achieved by this first layer 33, and the second layer 32 may be flexible and as thin as possible to reduce the distance d2. Typical values for the thickness of the second layer may be set from 0.02 millimeters to 0.2 millimeters. This design, placing the attachment portion of the circuit board 30 between the magnetic dipole 10 and the flip chip mounted Hall Effect sensor 20, allows to reduce the distance d2 in comparison to the distance d1, d'1 of the encoders of the prior art of the FIG. 1, FIG. 2, as there are less components involved in the stack up calculation. It may be contemplated to recover the first layer 33 and/or the second layer 32 with insulation layers of resin or paint, as well known in the art.

Figure 4:
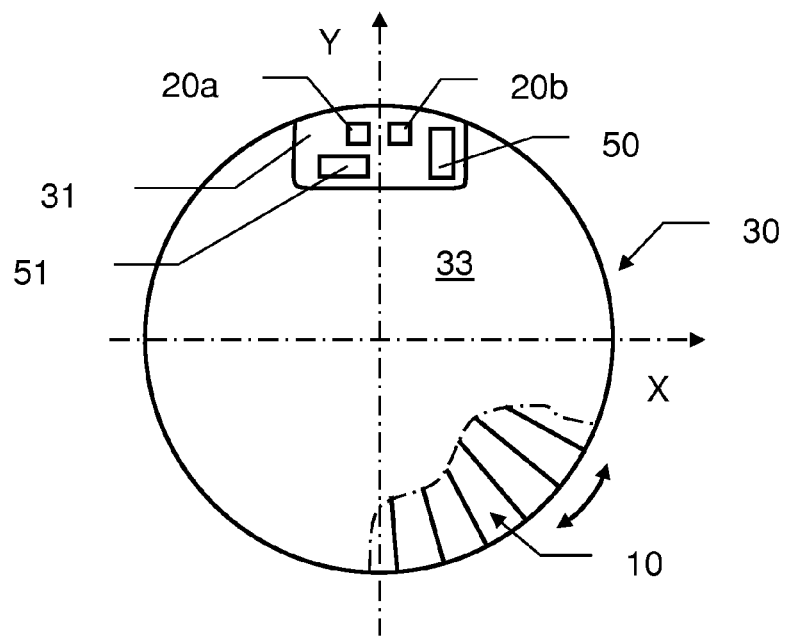
FIG. 4 represents another embodiment of an encoder according to the present invention.

The encoder of FIG. 4 is another embodiment of an encoder according to the present invention. The represented encoder is suitable to encode the rotational movement of a rotor of an electric motor. The encoder is seen from the circuit board side, so that the magnetic dipole 10 is only visible through the partial cut of the circuit board 30. The represented encoder is an incremental encoder, as there are two Hall Effect sensors 20a, 20b. They are arranged onto an attachment portion of the circuit board 30 where the thicker layer 33 is opened, so that the Hall Effect sensors 20a, 20b are arranged onto the conductive layer 31. Since there is a reduction of thickness in the attachment portion, some other electronic components 50, 51 may be also positioned onto the attachment portion, to reduce the axial packaging of the encoder. To enhance the accuracy of the encoder, it is advantageous to position the Hall Effect sensors 20a, 20b at the periphery of the encoder. In addition, it is advantageous to place the sensors at a minimum distance from the external edge of the magnetic dipole to reduce the edge effect. Typical minimum distance is comprised in the range from 0.25 millimeters to 1 millimeter from the external edge, and more particularly from 0.5 millimeters to 1 millimeter from the external edge. In association but not necessarily, the external diameter of the magnetic dipole may be set between 8 and 15 millimeters.

Regarding the dimension of the attachment portion, X dimension would be comprised in a range from two millimeters to ten millimeters, and Y dimension would be comprised in a range from one millimeter to ten millimeters.

Figure 5:
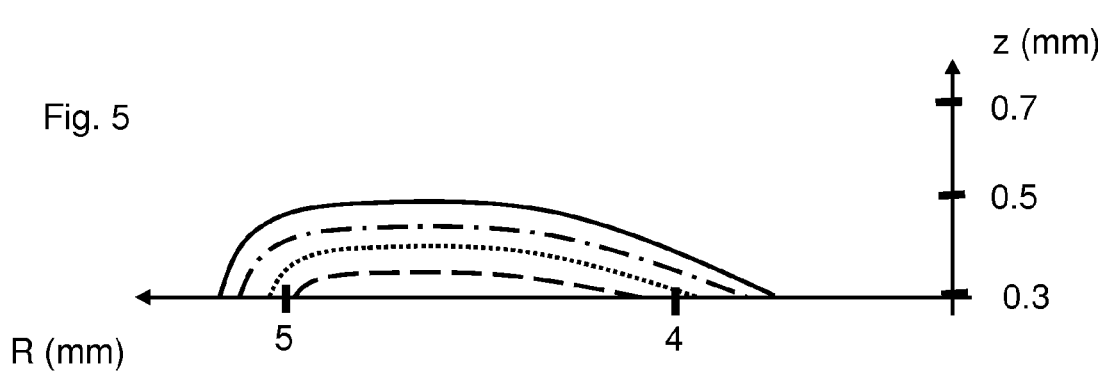
FIG. 5 represents a graph of the magnetic field created by a magnetic dipole, in relation to distance from the magnetic dipole.

FIG. 5 represents a graph where isolines of a magnetic field created by a magnetic disc are shown, in relation to an axial distance from the magnetic disc. This graph shows that the magnetic field decreases from approximately 100 mT at 0.3 mm from the disc to 20 mT at 0.5 mm from the disc. The magnetic field is very sensitive to the distance from the magnetic field, when no ferromagnetic counterpart is arranged to focus or concentrate the magnetic field. The invention is of importance in this case to increase the reliability of the encoder.

It is understood that obvious improvements and/or modifications for one skilled in the art maybe implemented and being under the scope of the invention as it is defined by the appended claims. In particular, it is said that the magnetic sensor may be a Hall Effect sensor, but other technologies may be used, such as Magneto Resistance sensors, Giant Magneto Resistance sensors, Anisotropic Magnetic resistance sensors.

The invention claimed is:

1. Encoder comprising:
   a moveable part with a magnetic dipole,
   a magnetic sensor with a sensitive area arranged to detect a magnetic field created by the magnetic dipole,
   a circuit board with a main thickness and having an attachment portion on which the magnetic sensor is mounted,
   wherein the magnetic sensor is a semiconductor die sensor with a sensitive area arranged on an external face of a semiconductor die,
   wherein the magnetic sensor is mounted onto the attachment portion of the circuit board, with the sensitive area in contact with the circuit board,
   and wherein the attachment portion is arranged between the magnetic sensor and the magnetic dipole and presents a reduced thickness compared to the main thickness of the rest of the circuit board.

2. Encoder as claimed in claim 1, wherein the magnetic sensor is a Hall Effect sensor.

3. Encoder as claimed in claim 1, comprising only one attachment portion of a reduced thickness and comprising two magnetic sensors, with a sensitive area arranged to detect a magnetic field created by the magnetic dipole, mounted onto the attachment portion, the sensitive area being in contact with the attachment portion.

4. Encoder as claimed in claim 3, wherein the two magnetic sensors are Hall Effect sensors.

5. Encoder as claimed in claim 3, wherein the moveable part comprises several magnetic dipoles spaced by a predetermined polar pitch, and wherein the two magnetic sensors are spaced by a distance less than two polar pitches.

6. Encoder as claimed in claim 5, wherein the polar pitch is less than 3 millimeters.

7. Encoder as claimed in claim 3, wherein the moveable part is moveable in rotation around a rotation axis and attached to a rotor of an electric motor, wherein the moveable part presents a circular shape with a predetermined external radius less than 8 millimeters, and wherein the two magnetic sensors are arranged at a distance from the rotation axis comprised between the external radius and the external radius minus 1.5 millimeter.

8. Encoder as claimed in claim 3, wherein the circuit board comprises only one conductive layer onto which the two magnetic sensors are mounted with the sensitive area in contact with the conductive layer.

9. Encoder as claimed in claim 8, wherein the only one conductive layer is arranged between a flexible insulating layer and a rigid insulating layer, the flexible insulating layer being thinner than the rigid insulating layer, and wherein the reduced thickness is formed by an opening in the rigid insulating layer.

10. Encoder as claimed in claim 8, wherein the encoder is arranged inside a housing and the only one conductive layer comprises a connecting portion located outside of the housing, and arranged to cooperate with a connector.

11. Encoder as claimed in claim 1, further comprising other electronic components, attached onto the attachment portion.

12. Encoder as claimed in claim 1, wherein the moveable part is moveable in rotation around a rotation axis and attached to a rotor of an electric motor.

13. Encoder as claimed in claim 1, further comprising electronic components attached onto the circuit board, and wherein the circuit board is over-molded so as to encapsulate the electronic components into an over-molding material.

\* \* \* \* \*